(12) United States Patent
Wang

(10) Patent No.: US 11,726,400 B2
(45) Date of Patent: Aug. 15, 2023

(54) LITHOGRAPHY PROCESS METHOD FOR DEFINING SIDEWALL MORPHOLOGY OF LITHOGRAPHY PATTERN

(71) Applicant: Shanghai Huahong Grace Semiconductor Manufacturing Corporation, Shanghai (CN)

(72) Inventor: Hui Wang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 466 days.

(21) Appl. No.: 16/922,753

(22) Filed: Jul. 7, 2020

(65) Prior Publication Data

US 2021/0048742 A1    Feb. 18, 2021

(30) Foreign Application Priority Data

Aug. 13, 2019 (CN) .......................... 201910742905.9

(51) Int. Cl.
*G03F 7/09* (2006.01)
*G03F 1/38* (2012.01)
(Continued)

(52) U.S. Cl.
CPC ................ *G03F 1/38* (2013.01); *G03F 7/091* (2013.01); *G03F 7/162* (2013.01); *G03F 7/20* (2013.01);
(Continued)

(58) Field of Classification Search
CPC . G03F 1/38; G03F 1/44; G03F 7/2008; G03F 7/091
See application file for complete search history.

(56) References Cited

U.S. PATENT DOCUMENTS

2003/0022070 A1* 1/2003 Lee .................. G03F 7/0005
430/5
2017/0003596 A1    1/2017 Wang
(Continued)

FOREIGN PATENT DOCUMENTS

CN     103681234 A    3/2014
CN     105511221 A    4/2016
(Continued)

*Primary Examiner* — Daborah Chacko-Davis
(74) *Attorney, Agent, or Firm* — Murtha Cullina LLP

(57) ABSTRACT

The present disclosure discloses a lithography process method for defining sidewall morphology of a lithography pattern, comprising: Step 1: designing a mask, wherein a mask pattern is formed on the mask, the mask pattern being used to define a lithography pattern; the lithography pattern has a sidewall, and a mask side face pattern structure that defines sidewall morphology of the lithography pattern is provided on the mask pattern, the mask side face pattern structure having a structure that enables an exposure light intensity to gradually change; Step 2: coating a to-be-exposed substrate with a photoresist; Step 3: exposing the photoresist by using the mask, and then performing development to form the lithography pattern; and Step 4: performing post-baking. The present disclosure can define the sidewall morphology of a lithography pattern, facilitating formation of a lithography pattern sidewall with an inclined side face.

15 Claims, 4 Drawing Sheets

(51) Int. Cl.
*G03F 7/16* (2006.01)
*G03F 7/20* (2006.01)
*G03F 7/26* (2006.01)
*G03F 7/40* (2006.01)
*G03F 7/00* (2006.01)
*H01L 21/027* (2006.01)

(52) U.S. Cl.
CPC .................. *G03F 7/26* (2013.01); *G03F 7/40* (2013.01); *G03F 7/70425* (2013.01); *H01L 21/0274* (2013.01)

(56) References Cited

U.S. PATENT DOCUMENTS

2018/0031975 A1* 2/2018 Sung ................ G03F 7/325
2019/0101819 A1   4/2019 Shi

FOREIGN PATENT DOCUMENTS

| CN | 106324998 A | 1/2017 |
| CN | 205880497 U | 1/2017 |
| CN | 108169841 A | 6/2018 |

* cited by examiner

LITHOGRAPHY PROCESS METHOD FOR DEFINING SIDEWALL MORPHOLOGY OF LITHOGRAPHY PATTERN

CROSS-REFERENCES TO RELATED APPLICATIONS

This application claims priority to Chinese patent application No. CN201910742905.9 filed on Aug. 13, 2019, and entitled "LITHOGRAPHY PROCESS METHOD FOR DEFINING SIDEWALL MORPHOLOGY OF LITHOGRAPHY PATTERN", the disclosure of which is incorporated herein by reference in entirety.

TECHNICAL FIELD

The present disclosure relates to methods for manufacturing semiconductor integrated circuits, in particular to a lithography process method for defining sidewall morphology of a lithography pattern.

BACKGROUND

The lithography pattern is defined as a precision surface processing technology in which pattern copying (i.e., exposure) and chemical etching (i.e., development) are combined. Generally, the etching process or doping process requires that an inclination angle of the photoresist morphology defined by lithography, that is, a side face an inclination of the sidewall of the lithography pattern, is close to 90 degrees. However, some special device processes require the lithography pattern morphology with a specific inclination angle, so as obtain the etching morphology with a specific gradient.

SUMMARY OF THE INVENTION

A technical problem to be solved by the present disclosure is to provide a lithography process method for defining sidewall morphology of a lithography pattern, which can define the sidewall morphology of a lithography pattern, facilitating formation of a lithography pattern sidewall with an inclined side face.

In order to solve the above technical problem, the lithography process method for defining sidewall morphology of a lithography pattern provided by the present disclosure comprises the following steps:

Step 1: designing a mask, wherein a mask pattern is formed on the mask, the mask pattern being used to define a lithography pattern.

The lithography pattern has a sidewall, and a mask side face pattern structure that defines sidewall morphology of the lithography pattern is provided on the mask pattern, the mask side face pattern structure having a structure that enables an exposure light intensity to gradually change, wherein in an area of a larger exposure light intensity, the height of the sidewall of the lithography pattern is smaller, and in an area of a smaller exposure light intensity, the height of the sidewall of the lithography pattern is larger.

Step 2: coating a to-be-exposed substrate with a photoresist.

Step 3: exposing the photoresist by using the mask, and then developing the photoresist to form the lithography pattern, wherein during an exposure process, the mask side face pattern structure defines the sidewall morphology of the lithography pattern by enabling the exposure light intensity to gradually change.

Step 4: post-baking the photoresist.

In a further improvement, the lithography pattern comprises a gap pattern and a line pattern.

In a further improvement, when the lithography pattern is a gap pattern, the lithography pattern has an inner side face, the mask pattern has an inner side face, the mask side face pattern structure is located on the inner side face of the mask pattern, and an area of a larger exposure light intensity in the mask side face pattern structure is closer to an inner side of the inner side face of the mask pattern, such that the sidewall of the lithography pattern has inner side face morphology with an inclination angle less than 90 degrees.

In a further improvement, regarding one of the gap patterns, a width direction of the gap pattern is an X direction, a length direction of the gap pattern is a Y direction, the inner side face morphology with an inclination angle less than 90 degrees is provided on at least one inner side face in the X direction or Y direction, and the inner side face morphologies of the gap patterns are the same or different.

In a further improvement, the mask side face pattern structure has a plurality of hollow structures in the shape of holes or slits in a top view, there is a solid structure between the hollow structures, the structure that enables the exposure light intensity to gradually change is formed by configuring sizes and arrangements of the hollow structures, and the exposure light intensity is larger when the size of the hollow structure is larger.

In a further improvement, a top view structure of the hollow structure is a square or circle; the hollow structures have a plurality of sizes, the hollow structures are arranged from outside to inside in the order of the size, starting from an inner side face of the mask pattern, and the hollow structure closer to the inner side has a larger size.

The hollow structures of the same size are arranged in a row, and the row formed by the arrangement of the hollow structures is parallel to a bottom edge of the inner side face of the mask pattern; and the number of the rows formed by the arrangements of the hollow structures is greater than 1.

In a further improvement, an arrangement density of the hollow structures is configured by configuring a first interval between the hollow structures in each row and a second interval between the hollow structures of different rows, and the exposure light intensity is larger when the arrangement density of the hollow structures is larger; the first intervals between the hollow structures in the same row are the same, the first intervals between the hollow structures of different rows are the same or different, and the first intervals are the same as or different from the second intervals.

The hollow structures of different rows are arranged to be staggered, and a width for staggering the hollow structures of two adjacent rows is greater than ⅕ of the size of the larger-sized hollow structure.

In a further improvement, when the lithography pattern is a line pattern, the lithography pattern has an outer side face, the mask pattern has an outer side face, the mask side face pattern structure is located on the outer side face of the mask pattern, and an area of a larger exposure light intensity in the mask side face pattern structure is closer to an outer side of the outer side face of the mask pattern, such that the sidewall of the lithography pattern has outer side face morphology with an inclination angle less than 90 degrees.

In a further improvement, regarding one of the line patterns, a width direction of the line pattern is an X direction, a length direction of the line pattern is a Y direction, the outer side face morphology with an inclination angle less than 90 degrees is provided on at least one outer side face in the X direction or Y direction, and the outer side face morphologies of the line patterns are the same or different.

In a further improvement, the mask side face pattern structure has a plurality of solid structures in the shape of holes or slits in a top view, there is a hollow structure between the solid structures, the structure that enables the exposure light intensity to gradually change is formed by configuring sizes and arrangements of the solid structures, and the exposure light intensity is smaller when the size of the solid structure is larger.

In a further improvement, a top view structure of the solid structure is a square or circle; the solid structures have a plurality of sizes, the solid structures are arranged from inside to outside in the order of the size, starting from an outer side face of the mask pattern, and the solid structure closer to the inner side has a larger size.

The solid structures of the same size are arranged in a row, and the row formed by the arrangement of the solid structures is parallel to a bottom edge of the outer side face of the mask pattern.

The number of the rows formed by the arrangements of the solid structures is greater than 1.

In a further improvement, an arrangement density of the solid structures is configured by configuring a first interval between the solid structures in each row and a second interval between the solid structures of different rows, and the exposure light intensity is smaller when the arrangement density of the solid structures is larger; the first intervals between the solid structures in the same row are the same, the first intervals between the solid structures of different rows are the same or different, and the first intervals are the same as or different from the second intervals.

The solid structures of different rows are arranged to be staggered, and a width for staggering the solid structures of two adjacent rows is greater than $\frac{1}{5}$ of the size of the larger-sized solid structure.

In a further improvement, the substrate in Step 2 is a wafer composed of a semiconductor substrate.

In a further improvement, before the coating with the photoresist in Step 2, the method further comprises a step of spin-coating a surface of the wafer with a bottom anti-reflection layer.

In a further improvement, the temperature of the post-baking is greater than 120° C. and the time of the post-baking is less than 120 seconds.

In the method of the present disclosure, the mask side face pattern structure is configured on the mask pattern of the mask by designing the mask, to form a gray scale mask. The mask side face pattern structure has the structure that enables the exposure light intensity to gradually change. During exposure, the exposure light intensity gradually changes on the side face of the mask pattern, the change in the exposure light intensity can cause a change in the morphology of the lithography pattern, thereby defining the sidewall morphology of the lithography pattern, facilitating formation of the lithography pattern sidewall with an inclined side face by means of processes such as exposure, development, and post-baking.

DETAILED DESCRIPTION

Figure 1:
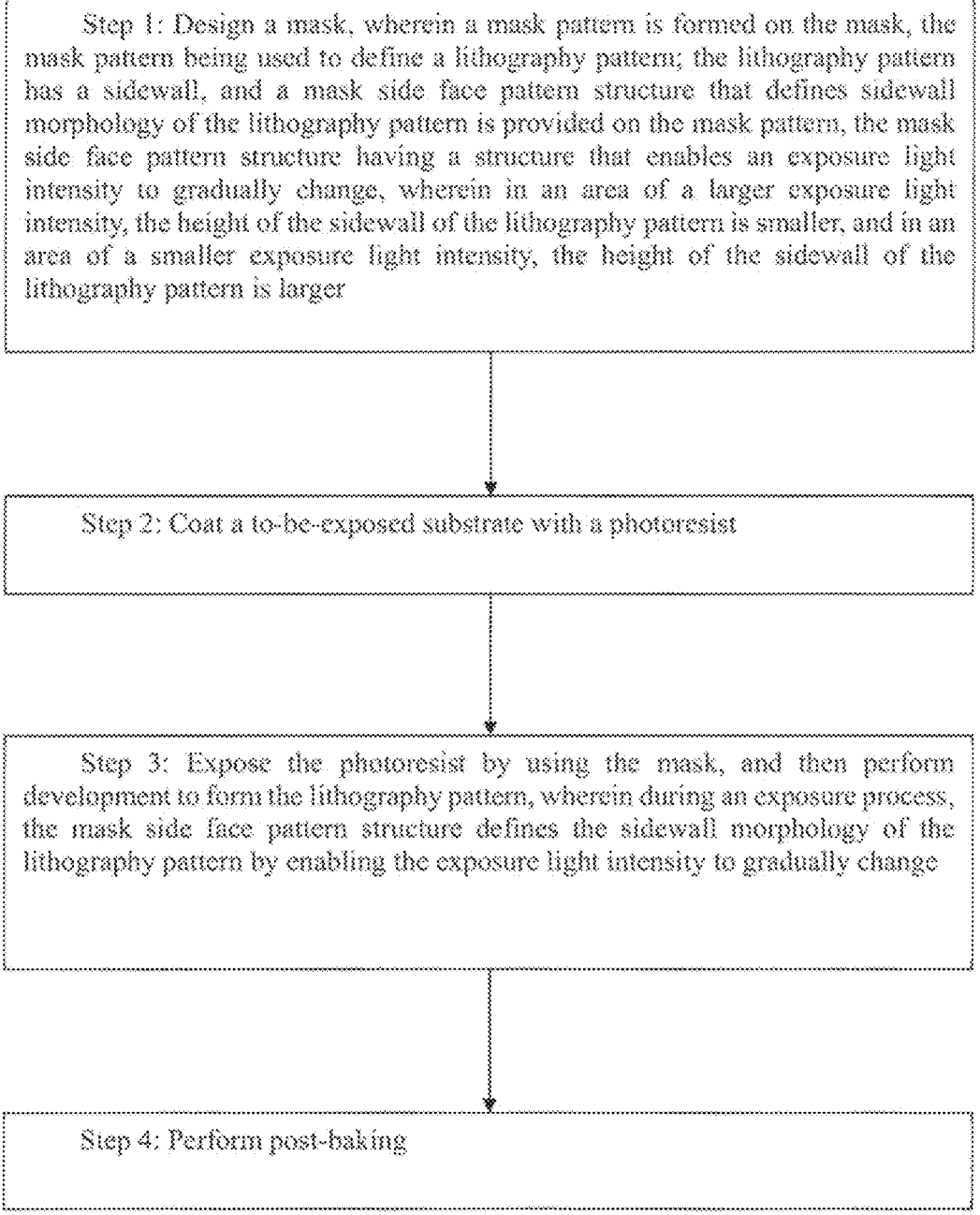
FIG. 1 is a flowchart of a lithography process method for defining sidewall morphology of a lithography pattern according to embodiments of the present disclosure.
Figure 2:
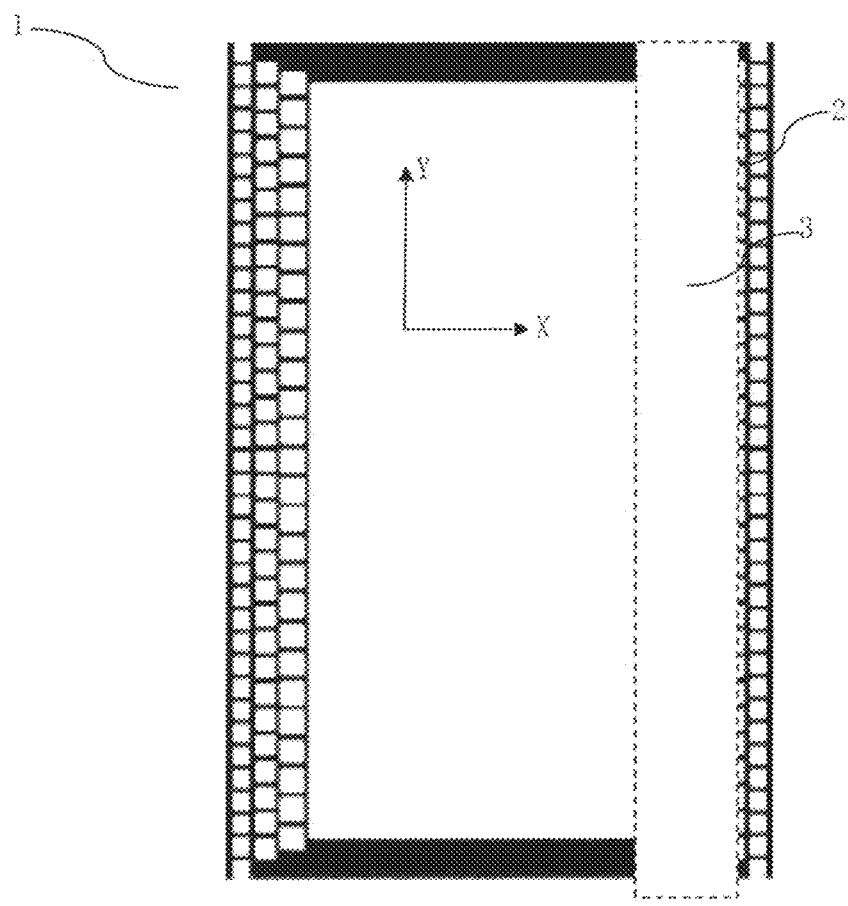
FIG. 2 is a structural drawing of a mask designed by the method according to embodiments of the present disclosure.
Figure 3:
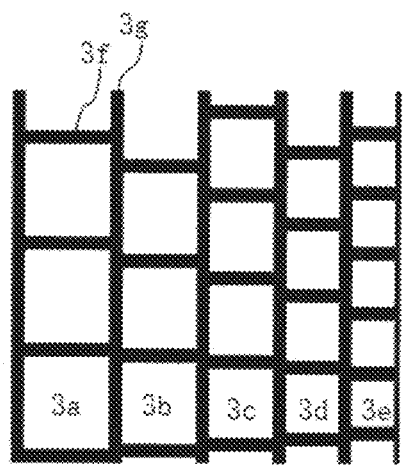
FIG. 3 is a partial enlarged drawing of a mask side face pattern structure in FIG. 2.
Figure 4:
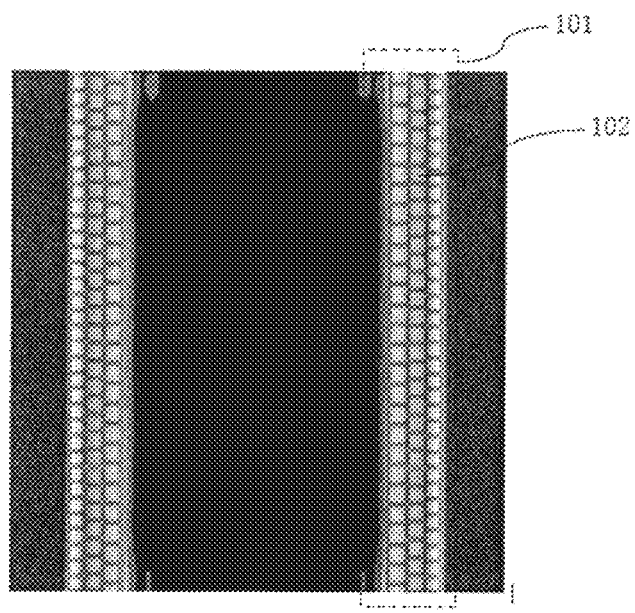
FIG. 4 is a drawing of an exposure light intensity distribution after exposure using the mask shown in FIG. 3.
Figure 5A:
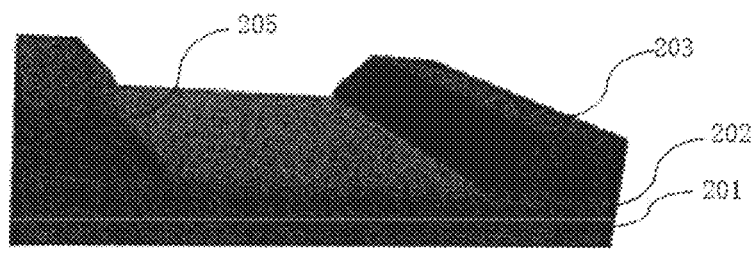
FIG. 5A is a 3D morphology simulation drawing of a photoresist pattern formed by using the mask shown in FIG. 2.
Figure 5B:
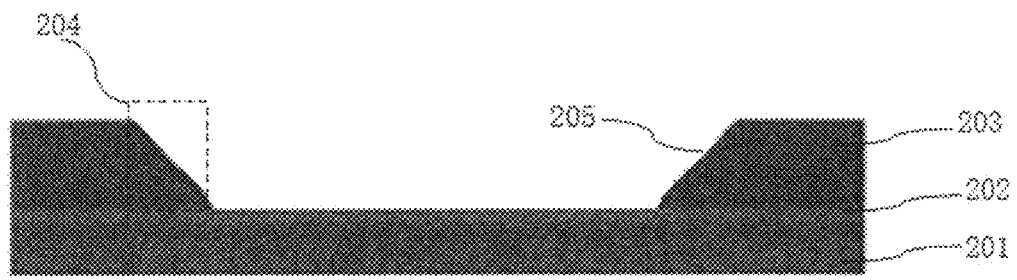
FIG. 5B is a morphology simulation drawing of a sectional structure of the photoresist pattern formed by using the mask shown in FIG. 2.

FIG. 1 illustrates a flowchart of a lithography process method for defining morphology of a sidewall 204 of a lithography pattern 203 according to embodiments of the present disclosure; FIG. 2 illustrates a structural drawing of a mask designed by the method according to embodiments of the present disclosure; FIG. 3 illustrates a partial enlarged drawing of a mask side face pattern structure 2 in FIG. 2; FIG. 4 illustrates a drawing of an exposure light intensity distribution after exposure using the mask shown in FIG. 3; FIG. 5A illustrates a 3D morphology simulation drawing of a photoresist pattern formed by using the mask shown in FIG. 2; and FIG. 5B illustrates a morphology simulation drawing of a sectional structure of the photoresist pattern formed by using the mask shown in FIG. 2. The lithography process method for defining the morphology of the sidewall 204 of the lithography pattern 203 according to embodiments of the present disclosure includes the following steps:

Step 1: design a mask, wherein a mask pattern 1 is formed on the mask, the mask pattern 1 being used to define the lithography pattern 203.

The lithography pattern 203 has the sidewall 204, and a mask side face pattern structure 2 that defines the morphology of the sidewall 204 of the lithography pattern 203 is provided on the mask pattern, the mask side face pattern structure 2 having a structure that enables an exposure light intensity to gradually change, wherein in an area of a larger exposure light intensity, the height of the sidewall 204 of the lithography pattern 203 is smaller, and in an area of a smaller exposure light intensity, the height of the sidewall 204 of the lithography pattern 203 is larger.

Step 2: coat a to-be-exposed substrate 201 with a photoresist.

The substrate 201 is a wafer composed of a semiconductor substrate.

Before the coating with the photoresist, the method further includes a step of spin-coating a surface of the wafer with a bottom anti-reflection layer 202.

Step 3: expose the photoresist by using the mask, and then develop the photoresist to form the lithography pattern 203, wherein during an exposure process, the mask side face pattern structure 2 defines the morphology of the sidewall 204 of the lithography pattern 203 by enabling the exposure light intensity to gradually change.

Step 4: post-bake the photoresist, wherein the temperature of the post-baking is greater than 120° C. and the time of the post-baking is less than 120 seconds.

In Step 1, the lithography pattern 203 shown in FIG. 2 is a gap pattern. When the lithography pattern 203 is a gap pattern, the lithography pattern 203 has an inner side face 205, the mask pattern 1 has an inner side face, the mask side face pattern structure 2 is located on the inner side face of the mask pattern 1, and an area of a larger exposure light intensity in the mask side face pattern structure 2 is closer to an inner side of the inner side face of the mask pattern 1, such that the sidewall 204 of the lithography pattern 203 has inner side face morphology with an inclination angle less than 90 degrees.

A width direction of the gap pattern is an X direction, a length direction of the gap pattern is a Y direction, the inner side face morphology with an inclination angle less than 90 degrees is provided on at least one inner side face in the X direction or Y direction, and the inner side face morphologies of the gap patterns are the same or different. FIG. 2 shows that the inner side face morphology with an inclination angle less than 90 degrees is formed on both two inner side faces in the Y direction, and the mask side face pattern structure 2 is formed on the two inner side faces in the Y direction in the mask pattern 1.

The mask side face pattern structure 2 has a plurality of hollow structures 3 in the shape of holes or slits in a top view, there is a solid structure between the hollow structures 3, the structure that enables the exposure light intensity to gradually change is formed by configuring sizes and arrangements of the hollow structures 3, and the exposure light intensity is larger when the size of the hollow structure 3 is larger.

A top view structure of the hollow structure 3 is a square, that is, a square hole; and in other embodiments, the top view structure of the hollow structure 3 is a circle. The hollow structures 3 have a plurality of sizes, the hollow structures 3 are arranged from outside to inside in the order of the size, starting from an inner side face of the mask pattern 1, and the hollow structure 3 closer to the inner side has a larger size.

The hollow structures 3 of the same size are arranged in a row, and the row formed by the arrangement of the hollow structures 3 is parallel to a bottom edge of the inner side face of the mask pattern 1; and the number of the rows formed by the arrangements of the hollow structures 3 is greater than 1. Referring to FIG. 2, the number of the rows formed by the arrangements of the hollow structures 3 is 5. The hollow structures of each row are marked with marks 3a, 3b, 3c, 3d, and 3e, respectively, wherein the direction from outside to inside, starting from the inner side face of the mask pattern 1, corresponds to the direction from the hollow structure 3e to the hollow structure 3a. It can be seen that the size of the hollow structure 3 gradually increases.

An arrangement density of the hollow structures 3 is configured by configuring a first interval, that is, the width of a line 3f, between the hollow structures 3 in each row and a second interval, that is, the width of a line 3g, between the hollow structures 3 of different rows, and the exposure light intensity is larger when the arrangement density of the hollow structures 3 is larger; the first intervals between the hollow structures 3 in the same row are the same, the first intervals between the hollow structures 3 of different rows are the same or different, and the first intervals are the same as or different from the second intervals.

The hollow structures 3 of different rows are arranged to be staggered, and a width for staggering the hollow structures 3 of two adjacent rows is greater than ⅕ of the size of the larger-sized hollow structure 3.

Referring to FIG. 4, an area shown by the dashed line box 101 is an exposure area corresponding to the mask side face pattern structure 2, and an area corresponding to the mark 102 is an exposure area corresponding to the hollow structure 3. It can be seen that, in the first embodiment of the present disclosure, by configuring the mask side face pattern structure 2, the exposure area can be well configured and the exposure light intensity of the exposure area can gradually change, thereby forming the sidewall 204 of the lithography pattern 203 with an inclined side face.

Alternatively, in Step 1, the lithography pattern 203 is a line pattern. The lithography pattern 203 has an outer side face, the mask pattern 1 has an outer side face, the mask side face pattern structure 2 is located on the outer side face of the mask pattern 1, and an area of a larger exposure light intensity in the mask side face pattern structure 2 is closer to an outer side of the outer side face of the mask pattern 1, such that the sidewall 204 of the lithography pattern 203 has outer side face morphology with an inclination angle less than 90 degrees.

Regarding one of the line patterns, a width direction of the line pattern is an X direction, a length direction of the line pattern is a Y direction, the outer side face morphology with an inclination angle less than 90 degrees is provided on at least one outer side face in the X direction or Y direction, and the outer side face morphologies of the line patterns are the same or different.

The mask side face pattern structure 2 has a plurality of solid structures in the shape of holes or slits in a top view, there is a hollow structure between the solid structures, the structure that enables the exposure light intensity to gradually change is formed by configuring sizes and arrangements of the solid structures, and the exposure light intensity is smaller when the size of the solid structure is larger.

A top view structure of the solid structure is a square or circle; the solid structures have a plurality of sizes, the solid structures are arranged from inside to outside in the order of the size, starting from an outer side face of the mask pattern 1, and the solid structure closer to the inner side has a larger size.

The solid structures of the same size are arranged in a row, and the row formed by the arrangement of the solid structures is parallel to a bottom edge of the outer side face of the mask pattern 1.

The number of the rows formed by the arrangements of the solid structures is greater than 1.

An arrangement density of the solid structures is configured by configuring a first interval between the solid structures in each row and a second interval between the solid structures of different rows, and the exposure light intensity is smaller when the arrangement density of the solid structures is larger; the first intervals between the solid structures in the same row are the same, the first intervals between the solid structures of different rows are the same or different, and the first intervals are the same as or different from the second intervals.

The solid structures of different rows are arranged to be staggered, and a width for staggering the solid structures of two adjacent rows is greater than ⅕ of the size of the larger-sized solid structure.

In the method of embodiments of the present disclosure, the mask side face pattern structure 2 is configured on the mask pattern 1 of the mask by designing the mask, to form a gray scale mask. The mask side face pattern structure 2 has the structure that enables the exposure light intensity to gradually change. During exposure, the exposure light intensity gradually changes on the side face of the mask pattern 1, the change in the exposure light intensity can cause a change in the morphology of the lithography pattern 203, thereby defining the morphology of the sidewall 204 of the lithography pattern 203, facilitating formation of the sidewall 204 of the lithography pattern 203 with an inclined side face by means of processes such as exposure, development, and post-baking.

The present disclosure has been described in detail above by using specific embodiments, but the description is not intended to limit the present disclosure. Without departing from the principles of the present disclosure, those skilled in the art could also make many variations and improvements, which should also be regarded as the protection scope of the present disclosure.

What is claimed is:

1. A lithography process method for defining sidewall morphology of a lithography pattern, comprising the following steps:

Step 1: designing a mask and forming a tangible mask according to a design, wherein a mask pattern is formed on the tangible mask, the mask pattern being used to define a lithography pattern;

the lithography pattern has a sidewall, and a mask side face pattern structure that defines sidewall morphology of the lithography pattern is provided on the mask pattern, the mask side face pattern structure having a structure that enables an exposure light intensity to gradually change, wherein in an area of a larger exposure light intensity, the height of the sidewall of the lithography pattern is smaller, and in an area of a smaller exposure light intensity, the height of the sidewall of the lithography pattern is larger;

the mask side face pattern structure has a plurality of first hollow structures in the shape of holes or slits in a top view, there is a first solid structure between the first hollow structures; or, the mask side face pattern structure has a plurality of second solid structures in the shape of holes or slits in a top view, there is a second hollow structure between the second solid structures;

Step 2: coating a to-be-exposed substrate with a photoresist;

Step 3: exposing the photoresist by using the mask, and then developing the photoresist to form the lithography pattern, wherein during an exposure process, the mask side face pattern structure defines the sidewall morphology of the lithography pattern by enabling the exposure light intensity to gradually change; and Step 4: post-exposure-baking the photoresist.

2. The lithography process method for defining sidewall morphology of a lithography pattern according to claim 1, wherein the lithography pattern comprises a gap pattern and a line pattern.

3. The lithography process method for defining sidewall morphology of a lithography pattern according to claim 2, wherein when the lithography pattern is a gap pattern, the lithography pattern has an inner side face, the mask pattern has an inner side face, the mask side face pattern structure is located on the inner side face of the mask pattern, and an area of a larger exposure light intensity in the mask side face pattern structure is closer to an inner side of the inner side face of the mask pattern, such that the sidewall of the lithography pattern has inner side face morphology with an inclination angle less than 90 degrees.

4. The lithography process method for defining sidewall morphology of a lithography pattern according to claim 3, wherein regarding the gap pattern, a width direction of the gap pattern is an X direction, a length direction of the gap pattern is a Y direction, the inner side face morphology with an inclination angle less than 90 degrees is provided on at least one inner side face in the X direction or Y direction, and the inner side face morphologies of the gap pattern are the same or different.

5. The lithography process method for defining sidewall morphology of a lithography pattern according to claim 3, wherein the mask side face pattern structure comprises a plurality of first hollow structures in the shape of holes or slits in a top view, there is a first solid structure between the first hollow structures, the structure that enables the exposure light intensity to gradually change is formed by configuring sizes and arrangements of the first hollow structures, and the exposure light intensity is larger when the size of the first hollow structure is larger.

6. The lithography process method for defining sidewall morphology of a lithography pattern according to claim 5, wherein a top view structure of the first hollow structure is a square or circle; the first hollow structures have a plurality of sizes, the first hollow structures are arranged from outside to inside in the order of the size, starting from an inner side face of the mask pattern, and the first hollow structure closer to the inner side has a larger size;

the first hollow structures of the same size are arranged in a row, and the row formed by the arrangement of the first hollow structures is parallel to a bottom edge of the inner side face of the mask pattern; and the number of rows formed by the arrangements of the first hollow structures is greater than 1.

7. The lithography process method for defining sidewall morphology of a lithography pattern according to claim 6, wherein an arrangement density of the first hollow structures is configured by configuring a first interval between the first hollow structures in each row and a second interval between the first hollow structures of different rows, and the exposure light intensity is larger when the arrangement density of the first hollow structures is larger; the first intervals between the first hollow structures in the same row are the same, the first intervals between the first hollow structures of different rows are the same or different, and the first intervals are the same as or different from the second intervals; and the first hollow structures of different rows are arranged to be staggered, and a width for staggering the first hollow structures of two adjacent rows is greater than ⅕ of the size of the larger-sized first hollow structure.

8. The lithography process method for defining sidewall morphology of a lithography pattern according to claim 2, wherein when the lithography pattern is a line pattern, the lithography pattern has an outer side face, the mask pattern has an outer side face, the mask side face pattern structure is located on the outer side face of the mask pattern, and an area of a larger exposure light intensity in the mask side face pattern structure is closer to an outer side of the outer side face of the mask pattern, such that the sidewall of the lithography pattern has outer side face morphology with an inclination angle less than 90 degrees.

9. The lithography process method for defining sidewall morphology of a lithography pattern according to claim 8, wherein regarding the line pattern, a width direction of the line pattern is an X direction, a length direction of the line pattern is a Y direction, the outer side face morphology with an inclination angle less than 90 degrees is provided on at least one outer side face in the X direction or Y direction, and the outer side face morphologies of the line pattern are the same or different.

10. The lithography process method for defining sidewall morphology of a lithography pattern according to claim 8, wherein the mask side face pattern structure comprises a plurality of second solid structures in the shape of holes or slits in a top view, there is a second hollow structure between the second solid structures, the structure that enables the exposure light intensity to gradually change is formed by configuring sizes and arrangements of the second solid structures, and the exposure light intensity is smaller when the size of the second solid structure is larger.

11. The lithography process method for defining sidewall morphology of a lithography pattern according to claim 10, wherein a top view structure of the second solid structure is a square or circle; the second solid structures have a plurality of sizes, the second solid structures are arranged from inside to outside in the order of the size, starting from an outer side face of the mask pattern, and the second solid structure closer to the inner side has a larger size;

the second solid structures of the same size are arranged in a row, and the row formed by the arrangement of the second solid structures is parallel to a bottom edge of the outer side face of the mask pattern; and the number of rows formed by the arrangements of the second solid structures is greater than 1.

12. The lithography process method for defining sidewall morphology of a lithography pattern according to claim 11, wherein an arrangement density of the second solid structures is configured by configuring a first interval between the second solid structures in each row and a second interval between the second solid structures of different rows, and the exposure light intensity is smaller when the arrangement density of the second solid structures is larger; the first intervals between the second solid structures in the same row are the same, the first intervals between the second solid structures of different rows are the same or different, and the first intervals are the same as or different from the second intervals; and the second solid structures of different rows are arranged to be staggered, and a width for staggering the second solid structures of two adjacent rows is greater than ⅕ of the size of the larger-sized second solid structure.

13. The lithography process method for defining sidewall morphology of a lithography pattern according to claim 1, wherein the substrate in Step 2 is a wafer composed of a semiconductor substrate.

14. The lithography process method for defining sidewall morphology of a lithography pattern according to claim 1, before the coating with the photoresist in Step 2, further comprising a step of spin-coating a surface of the wafer with a bottom anti-reflection layer.

15. The lithography process method for defining sidewall morphology of a lithography pattern according to claim 1, wherein the temperature of the post-exposure-baking is greater than 120° C. and the time of the post-exposure-baking is less than 120 seconds.

\* \* \* \* \*